(12) United States Patent
Crema et al.

(10) Patent No.: US 6,221,696 B1
(45) Date of Patent: Apr. 24, 2001

(54) PROCESS FOR IMPROVING THE ADHESION BETWEEN METAL AND PLASTIC IN CONTAINMENT STRUCTURES FOR ELECTRONIC SEMICONDUCTOR DEVICES

(75) Inventors: Paolo Crema, Vimercate; Carlo Alberto Passagrilli, Brugherio, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/397,488

(22) Filed: Sep. 16, 1999

(30) Foreign Application Priority Data

Sep. 17, 1998 (EP) .................................................. 98830540

(51) Int. Cl.⁷ .......................... H01L 21/44; H01L 21/48; H01L 21/50
(52) U.S. Cl. .......................................... 438/127; 438/118
(58) Field of Search .................................. 438/127, 398, 438/15, 118; 437/7, 8, 209; 257/58–68, 72, 75

(56) References Cited

U.S. PATENT DOCUMENTS

| | | | |
|---|---|---|---|
| 4,930,901 | | 6/1990 | Johnson et al. .......................... 372/26 |
| 5,378,508 | * | 1/1995 | Castro et al. .......................... 427/556 |
| 5,492,842 | * | 2/1996 | Eytcheson et al. ...................... 437/7 |
| 5,563,447 | * | 10/1996 | Lake et al. ............................. 257/724 |
| 5,722,161 | | 3/1998 | Marrs ...................................... 29/841 |
| 5,914,481 | * | 6/1999 | Danielson et al. .................... 235/472 |
| 6,083,937 | * | 7/2000 | Yamazaki et al. ...................... 257/59 |

FOREIGN PATENT DOCUMENTS

| | | |
|---|---|---|
| 37 24 109 A1 | 2/1989 | (DE) . |
| 39 39 527 A1 | 5/1991 | (DE) . |
| 0 497 744 A1 | 8/1992 | (EP) . |
| 0 867 935 A2 | 9/1998 | (EP) . |
| 07326699 | 12/1995 | (JP) . |
| 08236674 | 9/1996 | (JP) . |

\* cited by examiner

*Primary Examiner*—David Nelms
*Assistant Examiner*—Phuc T. Dang
(74) *Attorney, Agent, or Firm*—Theodore E. Galanthay; Robert Iannucci; Seed IP Law Group PLLC

(57) ABSTRACT

A process comprises the following operations: forming a structure of metal elements with functions of support and electrical connection, these metal elements having a high degree of surface finish; fixing a chip of semiconductor material, containing active parts and contact pads, to an area of a metal element of the structure acting as a support; electrically connecting the contact pads of the chip to predetermined metal elements of the structure acting as terminal conductors; and incorporating in plastic the chip of semiconductor material and part of the structure of metal elements. To improve the adhesion between the structure and the plastic, at least part of the surface of the metal elements is roughened by irradiation with a laser light beam.

16 Claims, 2 Drawing Sheets

PROCESS FOR IMPROVING THE ADHESION BETWEEN METAL AND PLASTIC IN CONTAINMENT STRUCTURES FOR ELECTRONIC SEMICONDUCTOR DEVICES

TECHNICAL FIELD

The present invention relates to the manufacture of electronic semiconductor devices and, more particularly, to a process for making an electronic semiconductor device comprising a structure of metal elements partially incorporated in a plastic body.

BACKGROUND OF THE INVENTION

As is known, integrated circuits and other active electronic devices or components are made on "chips" of semiconductor material having a surface area of a few mm$^2$, and require, for their connection to an external electrical circuit, suitable supporting, containment and electrical interconnection structures. A typical structure (package) suitable for the purpose includes a plastic body which encloses a chip which is soldered to an area of a metal supporting element of a metal structure formed by punching from a thin sheet and is connected, through thin metal wires soldered to suitable metallized areas (pads) provided on its surface, to corresponding electrical conductors which emerge from the plastic body and which also form part of the metal structure.

In the case of integrated power circuits, in other words devices intended to operate with high currents and, therefore, subject to considerable heating, these structures also comprise a metal plate through which the chip, which is fixed to it, can transfer to the exterior the heat produced during its operation.

The principal stages of the manufacture of the latter structures will now be described. The plate is formed by punching from a metal sheet, made for example of copper or copper alloys, possibly nickel-plated, possibly together with other identical plates which remain joined together by portions of the initial sheet which are designed to be removed by punching in a subsequent stage of processing. The chip is fixed on the metal plate by soldering with a low-melting-point alloy, for example a lead-tin alloy, or by gluing with a suitable adhesive, for example an epoxy adhesive. A set of metal strips, formed by punching from a thin sheet but still joined together by connecting portions and designed to become the terminal conductors of the device, are fixed to the plate, with at least part of the metal strips insulated electrically from the plate. Thin wires, usually made from gold, are welded at one end to the metallized areas of the chip with a low-melting-point alloy and at the other end to the ends of the metal strips, using a process, called "thermosonic", in which heat and ultrasound are applied simultaneously. The structure formed in this way, together with other identical structures having their corresponding plates and corresponding sets of interconnected metal strips, is then placed in a suitable mould, into which a plastic material in the liquid state, for example a thermosetting epoxy resin, is injected. After the polymerization of the resin, a multiplicity of structures is obtained, each comprising a solid plastic body which incorporates the elements described above with the exception of one face of the metal plate and part of the metal strips, in other words the terminal conductors of the device, and the interconnecting portions between them. These portions, together with the interconnecting portions between the plates, are then cut off and in this way the finished electronic devices are obtained.

A typical problem with the structures (packages) described above, and in general of any structure consisting of a plastic body and metal elements formed from sheets having a high level of surface finish, in other words a low roughness (for example, $R_a \leq 0.1$ μm in the case of nickel, $R_a \leq 0.4$ μm in the case of copper and copper alloys), is the low reliability, due to insufficient adhesion of the plastic body to the metal parts. It has been found that many of the failures of these devices are due to the ingress of moisture into the body through interstices between the metal terminals and the plastic body which are formed as a result of the cutting force, as a result of the difference between the coefficients of thermal expansion of the metal and the plastic, which is manifested between the metal and plastic in the cooling phase after the molding operation and during the normal thermal cycles of operation.

To resolve this problem at least partially, in other words to provide greater reliability and a more moisture-resistant seal, a known method is to treat the metal surfaces in such a way as to increase their roughness, for example by subjecting them to compression with molds having surfaces of predetermined roughness, or by subjecting them to sandblasting.

The technique based on molding is rather expensive, since it requires the preparation of individual molds and frequent maintenance operations to restore the desired degree of roughness of the mold, and the technique based on sandblasting is not suitable for use when the metal elements to be treated are of very small size, as in the case of lead frames for integrated circuits with a large number of pins. Furthermore, when a selective treatment of the metal surfaces is desired (as is often required in the case of frames with areas which must retain the original degree of finish to enable a chip of semiconductor material to be soldered to them), both of these known techniques require the use of masks: the first during the preparation and maintenance of the mold, and the second during the actual treatment. This further complicates the process.

SUMMARY OF THE INVENTION

An object of the present invention is to provide a manufacturing process that comprises a phase of roughening the metal surfaces which is simple and effective, both when the treatment has to be applied to the whole surface and when the treatment has to be selective, in other words when it has to be applied to only part of the surface.

BRIEF DESCRIPTION OF THE DRAWINGS

The invention will be more clearly understood from the following detailed description of one of its embodiments, provided by way of example and therefore not in any way respectively, in relation to the attached drawings.

DETAILED DESCRIPTION OF THE INVENTION

Figure 1:
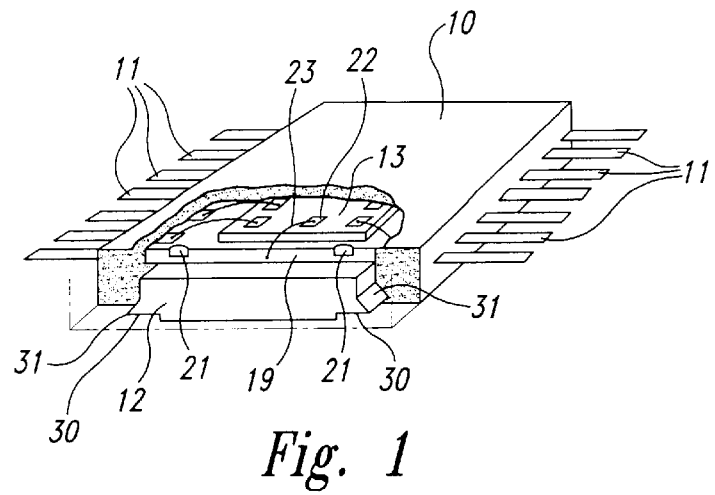
FIG. 1 is a perspective view of a structure which can be made by a process according to the invention, with a part removed to shown its interior.
Figure 2:
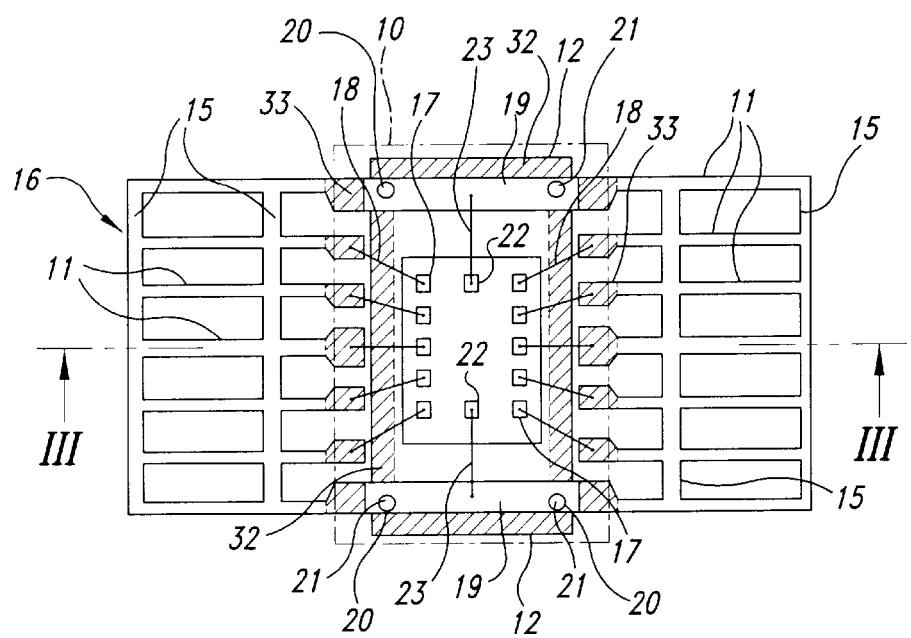
FIG. 2 is a plan view of the structure shown in FIG. 1, as it appears before the molding operation.
Figure 3:
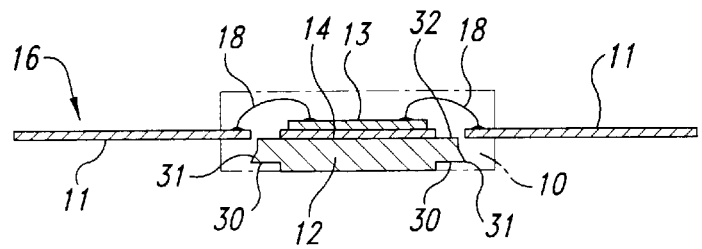
FIG. 3 is a sectional view as indicated by the line III—III in FIG. 2.

The structure of the electronic semiconductor device shown in FIGS. 1 to 3 comprises a plastic body 10, a multiplicity of metal strips or terminal conductors 11, a metal plate 12, and a chip 13 of semiconductor material in which an integrated circuit is formed and which is fixed to the metal plate 12 with a layer of alloy solder 14. The metal plate 12 preferably is made from copper or copper alloys, preferably nickel-plated, and provides support and heat dissipation. The terminal conductors 11 are formed, in the normal way, by punching from a single piece of thin sheet. Before being completely separated from each other after molding, preferably by punching again, they are joined together by interconnecting portions 15, in such a way as to form in combination a lead frame, indicated as a whole by the number 16, as seen in FIG. 2.

The metal plate 12 is also cut from a sheet which is thicker than the thin sheet used for the terminals, together with a certain number of other identical plates, not shown, which remain joined together by short interconnecting portions designed to be removed subsequently, by cutting or by another method, after the simultaneous formation of the plastic bodies in a single mould.

The frame 16 has two opposite lateral strips which form two bars 19 inside the plastic body and two pairs of terminals which project from the body. Each bar 19 has two holes 20 which enable the frame 16 to be fixed to the plate 12 by means of suitable posts 21 projecting from the plate through the holes 20. After the insertion of the posts 21 into the holes 20, the posts are clinched to fix the bars 19 and the whole frame 16 in position on the plate. In this way an intermediate product is formed, consisting of a multiplicity of interconnected structures, each consisting of a plate 12 and a frame 16.

The ends of the terminal conductors inside the frame 16 and the central parts of the bars 19 are then connected by the known method described above to the metallized areas 17 of the chip by means of thin gold wires 18.

After the formation of the plastic body 10 and the punching of the interconnecting portions 15 of the frame 16, carried out in the usual way, the structure shown in FIG. 1 is obtained.

To improve the adhesion between the plastic body 10 and the metal plate 12, according to a known technique, the plate is shaped along its periphery in such a way that it has undercut surfaces, indicated by the number 30, and a lateral projection at an acute angle, indicated by 31, substantially along the whole of its periphery. To simplify the drawing, in FIG. 1 the undercut surfaces are shown only along the longer sides of the plate.

In the normal techniques, both the sheet from which the plates of the heat sinks are formed and the thin sheet from which the terminal conductors are formed have a high degree of surface finish, in other words a very low degree of roughness, for example $R_a \leq 0.1\ \mu m$ for nickel or $R_a \leq 0.4\ \mu m$ for copper and copper alloys. To improve the adhesion between the plastic and the metal, the plate and the frame of the terminal conductors, before being assembled, are treated in such a way as to roughen all or part of their surfaces.

In the example shown in the drawing, the surfaces with controlled roughness are peripheral areas of the plate 12, more precisely those delimited by the undercut surface 30 and the edge 32 opposite this surface on the upper face, as shown by hatching in FIG. 2, and the areas 33 of the enlarged end parts, partially incorporated in the body 10, of the terminal conductors 11, also shown by hatching in FIG. 2, on both faces. The roughness of these areas is produced, according to the invention, by selective irradiation with a laser light beam.

Figure 4:
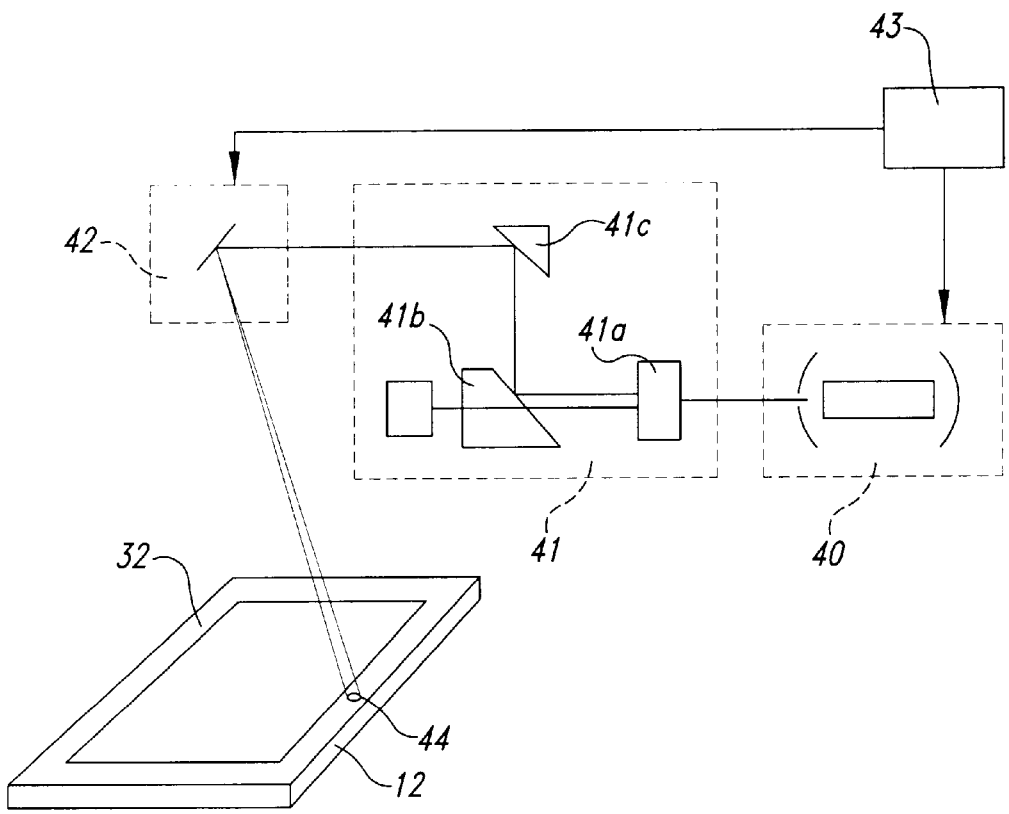
FIG. 4 shows schematically an apparatus for the practical application of a phase characteristic of a process according to the invention and, in perspective, a metal plate subjected to a treatment with this apparatus.
Figure 5:
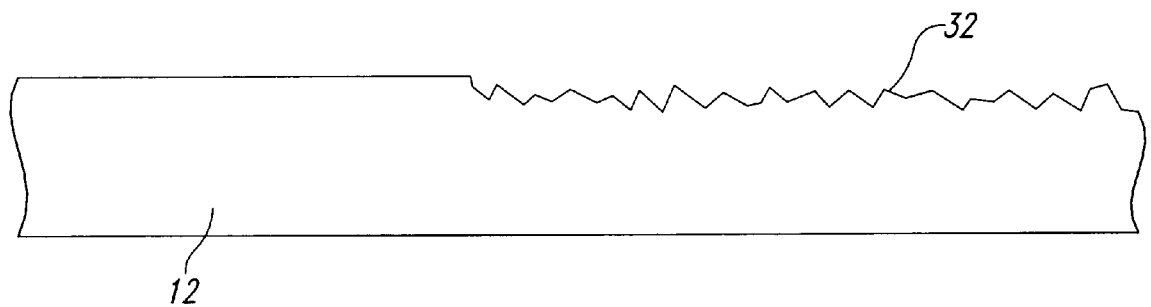
FIG. 5 shows an enlarged part of the metal plate in cross-section after the treatment.

The equipment used to apply the process according to the invention, as shown schematically in FIG. 4, consists substantially of a laser 40, a unit 41 for the frequency conversion, selection and deflection of the laser beam, an optical scanning device 42 and a synchronizing unit 43.

The laser 40 may be selected from industrial lasers which emit radiation which can be largely absorbed by metals, with wavelengths of between 200 and 1000 nm.

In practice, the laser used is of the neodymium YAG type, which basically consists of a crystal of yttrium and aluminum doped with neodymium in the form of a rod having mirrors at its ends, which radiates at a wavelength of 1064 nm (infrared light) with pulses whose duration is between 6 and 8 ns. The frequency of repetition of the pulses in this application was regulated to approximately 30 Hz. The output beam of the laser 40 is applied to a frequency converter 41a, consisting of a crystal of $KH_2PO_4$ (biacid phosphate of potassium deuterate) which, with a conversion efficiency of approximately 30–35%, supplies at its output a beam having a frequency equal to twice the input frequency, in other words a wavelength which is halved, equal to 532 nm (green visible light). This is advantageous, since metals commonly employed for forming the metal plate and the lead frame absorb the radiation at 532 nm significantly more than the radiation at 1064 nm, the latter being reflected for a 90% or more. A dichroic mirror 41b separates the beam having double frequency from the residual beam at the laser output frequency, by deflecting it to a mirror 41c which, in turn, deflects it to the scanning device 42. This scanning device consists of an optical system capable of directing the 532 nm laser beam in a controllable way on to predetermined areas of the surface to be treated, in this example the edge areas of the plate 12, indicated by the number 32 in FIG. 2, whose roughness has to be increased. The synchronization unit 43 synchronizes the emission of the laser pulses with the scanning.

The laser beam strikes the surface of the body to be treated, in this example the plate 12, on a substantially circular elementary area 44, with an energy which is regulated in such a way as to erode the metal causing the formation of plasma. Due to multimode oscillation, the Nd:YAG laser beam exhibits a non-uniform distribution of energy density, so that the energy density striking the elementary area 44 varies from point to point. In this way, micrometric roughness is obtained on the surface of the body stroke by the laser beam.

The scanning of the laser beam is controlled in such a way that the surface of the plate is struck by the beam along a predetermined path, in other words, in this example, along the edge of the plate, the elementary areas corresponding to successive pulsed beams being made to overlap partially. In a practical application of the process, the diameter of the elementary area 44 was approximately 2 mm, and the energy of the beam was regulated to a value of between 150 and 300 mJ. Preferably, the elementary areas overlapped by approximately 50%.

Adhesion tests carried out on specimens of different metals have shown that the process according to one embodiment of the invention is particularly effective when applied to nickel substrates with a degree of surface finish of approximately $Ra=0.07\ \mu m$. After treatment, the roughness was approximately Ra=0.2 μm. In the case of copper or copper alloys substrates, starting from a degree of surface finish of approximately Ra=0.39 μm, the roughness after the treatment was approximately Ra=1.10 μm.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for the manufacture of a semiconductor device, comprising the following operations:
   a. providing a chip of semiconductor material containing active parts and contact pads;
   b. forming a structure of metal elements including a first metal element for support of the chip and second metal elements for electrical connection of the contact pads to an external electrical circuit, these metal elements having a high degree of surface finish;
   c. fixing the chip of semiconductor material to an area of the first metal element;
   d. electrically connecting the contact pads of the chip to the second metal elements;
   e. roughening part of a surface of the metal elements by irradiation with a laser light beam;
   f. incorporating in plastic the chip of semiconductor material and part of the structure of metal elements, the plastic contacting the part of the surface that was roughened.

2. The process according to claim 1, in which the laser light has a predetermined wavelength of between 200 and 1000 nm.

3. A process for the manufacture of a semiconductor device, comprising the following operations:
   a. forming a structure of metal elements with functions of support and electrical connection, these metal elements having a high degree of surface finish,
   b. fixing a chip of semiconductor material, containing active parts and contact pads, to an area of a metal element of the structure acting as a support,
   c. electrically connecting the contact pads of the chip to predetermined metal elements of the structure acting as terminal conductors,
   d. incorporating in plastic the chip of semiconductor material and part of the structure of metal elements,
   wherein operation a. comprises a phase of roughening at least part of the surface of the metal elements by irradiation with a laser light beam and wherein the laser light has a wavelength of approximately 532 nm and is obtained by doubling the frequency of the radiation emitted by a laser of the neodymium YAG type.

4. The process according to claim 1, in which the laser light is pulsed.

5. The process according to claim 4, in which the duration of the laser light pulses has a predetermined value of between 6 and 8 ns.

6. A process for the manufacture of a semiconductor device, comprising the following operations:
   a. forming a structure of metal elements with functions of support and electrical connection, these metal elements having a high degree of surface finish,
   b. fixing a chip of semiconductor material, containing active parts and contact pads, to an area of a metal element of the structure acting as a support,
   c. electrically connecting the contact pads of the chip to predetermined metal elements of the structure acting as terminal conductors,
   d. incorporating in plastic the chip of semiconductor material and part of the structure of metal elements,
   wherein operation a. comprises a phase of roughening at least part of the surface of the metal elements by irradiation with a laser light beam that is pulsed, wherein in each pulse the beam strikes the surface subjected to roughening on an elementary area and in which the beam is directed in such a way that the surface is struck by the beam along a predetermined path of elementary areas, the elementary areas of successive pulsed beams being made to overlap partially.

7. A process for the manufacture of a semiconductor device, comprising the following operations:
   a. forming a structure of metal elements with functions of support and electrical connection, these metal elements having a high degree of surface finish,
   b. fixing a chip of semiconductor material, containing active parts and contact pads, to an area of a metal element of the structure acting as a support,
   c. electrically connecting the contact pads of the chip to predetermined metal elements of the structure acting as terminal conductors,
   d. incorporating in plastic the chip of semiconductor material and part of the structure of metal elements,
   wherein operation a. comprises a phase of roughening at least part of the surface of the metal elements by irradiation with a laser light beam and wherein the area of a metal element of the structure on which the chip of semiconductor material is fixed is not subjected to the roughening phase.

8. A semiconductor device made according to the process of claim 1, wherein the structure of metal elements is, at least partially, made from nickel-plated copper.

9. A process for manufacturing a semiconductor device, comprising:
   fixing a chip of semiconductor material, containing active parts and contact pads, to a central area of a front face of a metal plate, the front face also having a peripheral edge surrounding the central area;
   mechanically coupling a metal lead frame to the metal plate, the metal lead frame including terminal conductors with end portions fixed adjacent to the metal plate;
   electrically coupling the end portions of the terminal conductors to the contact pads of the chip;
   roughening the end portions of the terminal conductor and a peripheral edge of the metal plate by irradiation with a laser light beam; and
   incorporating in plastic the chip, metal plate, and end portions of the terminal conductors, wherein the roughened end portions of the terminal conductor and peripheral edge of the metal plate.

10. The process according to claim 9 wherein the laser light has a predetermined wavelength of between 200 and 1000 nm.

11. A process for manufacturing a semiconductor device, comprising:
   fixing a chip of semiconductor material, containing active parts and contact pads, to a central area of a front face of a metal plate, the front face also having a peripheral edge surrounding the central area;
   mechanically coupling a metal lead frame to the metal plate, the metal lead frame including terminal conductors with end portions fixed adjacent to the metal plate;

electrically coupling the end portions of the terminal conductors to the contact pads of the chip; and incorporating in plastic the chip, metal plate, and end portions of the terminal conductors, wherein the end portions of the terminal conductor and peripheral edge of the metal plate are roughened by irradiation with a laser light beam having a wavelength of approximately 532 nm and which is obtained by doubling the frequency of the radiation emitted by a laser of the neodymium YAG type.

12. The process according to claim 9, in which the laser light is pulsed.

13. The process according to claim 12, in which the duration of the laser light pulses has a predetermined value of between 6 and 8 ns.

14. A process for manufacturing a semiconductor device, comprising:

fixing a chip of semiconductor material, containing active parts and contact pads, to a central area of a front face of a metal plate, the front face also having a peripheral edge surrounding the central area;

mechanically coupling a metal lead frame to the metal plate, the metal lead frame including terminal conductors with end portions fixed adjacent to the metal plate;

electrically coupling the end portions of the terminal conductors to the contact pads of the chip; and incorporating in plastic the chip, metal plate, and end portions of the terminal conductors, wherein the end portions of the terminal conductor and peripheral edge of the metal plate are roughened by irradiation with a laser light beam that is pulsed, wherein in each pulse the beam strikes the surfaces subjected to roughening on an elementary area and in which the beam is directed in such a way that the surface is struck by the beam along a predetermined path of elementary areas, the elementary areas of successive pulsed beams being made to overlap partially.

15. A process for manufacturing a semiconductor device, comprising:

fixing a chip of semiconductor material, containing active parts and contact pads, to a central area of a front face of a metal plate, the front face also having a peripheral edge surrounding the central area;

mechanically coupling a metal lead frame to the metal plate, the metal lead frame including terminal conductors with end portions fixed adjacent to the metal plate;

electrically coupling the end portions of the terminal conductors to the contact pads of the chip; and incorporating in plastic the chip, metal plate, and end portions of the terminal conductors, wherein the end portions of the terminal conductor and peripheral edge of the metal plate are roughened by irradiation with a laser light beam, wherein the step of roughening the peripheral edge of the front face of the metal plate includes selectively roughening the front face so that the peripheral edge is roughened without roughening the central area.

16. A process for manufacturing a semiconductor device, comprising:

fixing a chip of semiconductor material, containing active parts and contact pads, to a central area of a front face of a metal plate, the front face also having a peripheral edge surrounding the central area;

mechanically coupling a metal lead frame to the metal plate, the metal lead frame including terminal conductors with end portions fixed adjacent to the metal plate;

electrically coupling the end portions of the terminal conductors to the contact pads of the chip; and incorporating in plastic the chip, metal plate, and end portions of the terminal conductors, wherein the end portions of the terminal conductor and peripheral edge of the metal plate are roughened by irradiation with a laser light beam, wherein the peripheral edge of the metal plate and the end portions of the terminal conductors are roughened before the terminal conductors and chip are mechanically coupled to the metal plate.

* * * * *

UNITED STATES PATENT AND TRADEMARK OFFICE
CERTIFICATE OF CORRECTION

PATENT NO.    : 6,221,696 B1
DATED         : April 24, 2001
INVENTOR(S)   : Paolo Crema and Carlo Alberto Passagrilli It is certified that error appears in the above-identified patent and that said Letters Patent is hereby corrected as shown below:

Title page,
Item [30], the foreign priority application number should read -- 98830540.5 --.

Signed and Sealed this

Thirteenth Day of November, 2001

Attest:

*Nicholas P. Godici*

NICHOLAS P. GODICI
*Attesting Officer*    *Acting Director of the United States Patent and Trademark Office*